(12) United States Patent
Pramanik et al.

(10) Patent No.: US 6,928,635 B2
(45) Date of Patent: Aug. 9, 2005

(54) SELECTIVELY APPLYING RESOLUTION ENHANCEMENT TECHNIQUES TO IMPROVE PERFORMANCE AND MANUFACTURING COST OF INTEGRATED CIRCUITS

(75) Inventors: Dipankar Pramanik, Saratoga, CA (US); Michael Sanie, Menlo Park, CA (US)

(73) Assignee: Numerical Technologies, Inc., San Jose, CA (US)

( * ) Notice: Subject to any disclaimer, the term of this patent is extended or adjusted under 35 U.S.C. 154(b) by 355 days.

(21) Appl. No.: 10/254,702

(22) Filed: Sep. 25, 2002

(65) Prior Publication Data

US 2004/0060020 A1 Mar. 25, 2004

(51) Int. Cl.$^7$ .............................................. G06F 17/50
(52) U.S. Cl. ..................................................... 716/21
(58) Field of Search ........................... 716/21; 364/489; 430/5

(56) References Cited

U.S. PATENT DOCUMENTS

| | | | |
|---|---|---|---|
| 5,631,110 A | 5/1997 | Shioiri et al. ................... 430/5 |
| 5,682,323 A | 10/1997 | Pasch et al. ................. 364/491 |
| 5,723,233 A | 3/1998 | Garza et al. ..................... 430/5 |
| 5,815,685 A | 9/1998 | Kamon ........................ 395/500 |
| 5,825,647 A | 10/1998 | Tsudaka ................. 364/167.03 |
| 5,923,566 A | * 7/1999 | Galan et al. ................... 716/21 |
| 5,991,006 A | 11/1999 | Tsudaka ........................ 355/53 |
| 6,014,456 A | 1/2000 | Tsudaka ....................... 385/144 |
| 6,081,658 A | 6/2000 | Rieger et al. .......... 395/500.22 |
| 6,154,563 A | 11/2000 | Tsudaka ....................... 382/144 |
| 6,243,855 B1 | 6/2001 | Kobayashi et al. ............ 716/19 |
| 6,249,597 B1 | 6/2001 | Tsudaka ....................... 382/144 |
| 6,289,499 B1 | 9/2001 | Rieger et al. ................. 716/21 |
| 6,298,473 B1 | 10/2001 | Ono et al. ..................... 716/21 |
| 6,453,457 B1 | 9/2002 | Pierrat et al. ................. 716/19 |
| 6,543,045 B2 | * 4/2003 | Ludwig et al. ................ 716/21 |
| 2002/0100004 A1 | 7/2002 | Pierrat et al. ................... 716/5 |

FOREIGN PATENT DOCUMENTS

| | | |
|---|---|---|
| GB | 2324169 A | 10/1998 |
| JP | 3-80525 | 4/1991 |
| WO | WO 00/67074 A1 | 11/2000 |

OTHER PUBLICATIONS

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman, J., et al., "Wafer Proximity Correction and Its Impact on Mask–Making", Bacus News, vol. 10, Issue 1, pp. 1, 3–7, 10–12, Jan. 1994.

Henderson, R., et al., "Optical Proximity Effect Correction: An Emerging Technology", Microlithography World, pp. 6–12 (1994).

(Continued)

Primary Examiner—John F. Niebling
Assistant Examiner—Andre' Stevenson
(74) Attorney, Agent, or Firm—Park, Vaughan & Fleming LLP

(57) ABSTRACT

One embodiment of the present invention provides a system that applies resolution enhancement techniques (RETs) selectively to a layout of an integrated circuit. Upon receiving the layout of the integrated circuit, the system identifies a plurality of critical regions within the layout based on an analysis of one or more of, timing, dynamic power, and off-state leakage current. The system then performs a first set of aggressive RET operations on the plurality of critical regions. The system also performs a second set of less aggressive RET operations on other non-critical regions of the layout.

18 Claims, 6 Drawing Sheets

OTHER PUBLICATIONS

Barouch, E., et al., "OPTIMASK: An OPC Algorithm for Chrome and Phase–Shift Mask Design", SPIE, Vo. 2440, pp. 192–206, Feb. 1995.

Cobb, N., et al., "Fast, Low–Complexity Mask Design", SPIE, vol. 2440, pp. 313–327, Feb. 22–24, 1995.

Yen, A., et al., "Characterization and Correction of Optical Proximity Effects in Deep–Ultraviolet Lithography Using Behavior Modeling", J. Vac. Sci. Technol. B. vol. 14, No. 6, pp. 4175–4178, Nov./Dec. 1996.

Morimoto, H., et al., "Next Generation Mask Strategy—Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Dolainsky, C., et al., "Application of a Simple Resist Model to Fast Optical Proximity Correction"SPIE, vol. 3051, pp. 774–780 (1997).

Chuang, II., et al., "Practical Applications of 2–D Optical Proximity Corrections for Enhanced Performance of 0.25um Random Logic Devices", IEEE, pp. 18.7.1–18.7.4, Dec. 1997.

Cobb, N. et al., "Experimental Results on Optical Proximity Correction With Variable Threshold Resist Model", SPIE, vol. 3051, pp. 458–468, Mar. 12–14, 1997.

Asai, N., "Proposal for the Coma Aberration Dependent Overlay Error Compensation Technology", Jpn. J. Appl. Phys., vol. 37, pp. 6718–6722 (1998).

Cobb, N., "Fast Optical and Process Proximity Correction Algorithms for Integrated Circuit Manufacturing", Dissertation, University of California at Berkeley, UMI Microform 9902038 (139 pages).

Ackmann, P., et al., "Phase Shifting and Optical Proximity Corrections to Improve CD Control on Logic Devices in Manufacturing for Sub 0.35 um I–Line", SPIE, vol. 3051, pp. 146–153, Mar. 12–14, 1997.

Lithas, "Lithas: Optical Proximity Correction Software"(2 pages).

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity–Corrected Patterns", Precim Company, Portland, Oregon (10 pages).

Rieger, M., et al., "Using Behavior Modeling for Proximity Correction", Precim Company, Portland, Oregon (6 pages).

Cobb, et al., "Fast Sparse Aerial Image Calculation for OPC", SPIE, vol. 2621, pp. 534–544, Sep. 20–22, 1995.

Lucas, K., et al., "Model Based OPC for 1st Generation 193nm Lithography", Motorola Inc., IDT assignee to IMEC (12 pages).

Stirniman, J., et al., "Quantifying Proximity and Related Effects in Advanced Wafer Processes", Precim Compnay, Hewlett Packard Labs (9 pages).

Sugawara, M., et al., "Practical Evaluation of Optical Proximity Effect Correction by EDM Methodology", Sony Corporation (11 pages).

Saleh, B., et al., "Reduction of Errors of Microphotographic Reproductions by Optimal Corrections of Original Masks", Optical Engineering, vol. 20, No. 5, pp. 781–784, Sep./Oct. 1981.

Fu, C.C., et al., "Enhancement of Lithographic Patterns by Using Serif Features", IEEE, Transactions On Electron Devices, vol. 38, No. 12, pp. 2599–2603, Dec. 1991.

Harafuji, K., et al., "A Novel Hierarchical Approach for Proximity Effect Correction in Electron Beam Lithography", IEEE, vol. 12, No. 10, pp. 1508–1514, Oct. 1993.

Rieger, M., et al., "System for Lithography Proximity Compensation", Precim Company, Portland, Oregon, Sep. 1993 (28 pages).

Toublan, O., et al., "Phase Aware Proximity Correction for Advanced Masks", SPIE, vol. 4000, pp. 160–170, Mar. 1–3, 2000.

Anonymous, "Modifying Traditional Model Optical Proximity Correction (MOPC) Flow To Include Mask Writer Issues", IPCOM000009586D, Sep. 4, 2002 (1 page).

Anonymous, "Parameterization For Full Shape And Rule Dependent Dissection", IPCOM000009587D, Sep. 4, 2002, (9 pages).

* cited by examiner

SELECTIVELY APPLYING RESOLUTION ENHANCEMENT TECHNIQUES TO IMPROVE PERFORMANCE AND MANUFACTURING COST OF INTEGRATED CIRCUITS

BACKGROUND

1. Field of the Invention

The invention relates to the process of fabricating semiconductor chips. More specifically, the invention relates to a method and an apparatus to reduce the amount of resolution enhancement applied to a die by selectively modifying transistor gate lengths to improve the speed of critical transistors that affect timing of a circuit, while limiting the static power consumption of other transistors in the circuit

2. Related Art

Recent advances in integrated circuit technology have largely been accomplished by decreasing the feature size of circuit elements on a semiconductor chip. Reducing the feature size increases the speed at which circuits can operate and increases the number of circuit elements that can be incorporated onto a semiconductor chip.

Unfortunately, as feature size continues to decrease, off-state leakage current from transistors increases, which can greatly increase the static power consumption of a chip. Hence, circuits with tens of millions of transistors fabricated with 130 nm and below process technology have to tradeoff performance with off-state leakage current.

High performance is achieved through faster transistors that have small gate-lengths and low threshold voltages. However, these fast transistors also have large off-state leakage currents. Referring to FIG. 1, a polysilicon field effect transistor 100 is comprised of a polysilicon line 104 that forms a transistor gate 106 between a source diffusion region 102 and a drain diffusion region 108. The "gate length" of transistor 100 is the width of the polysilicon line 104 in the gate region 106 between source diffusion region 102 and drain diffusion region 108. This gate length is indicated by the arrows in FIG. 1.

When this gate length decreases, the off-state leakage current, $I_{off}$, increases as is illustrated in the graph in FIG. 2. Note that as the gate length, L, decreases in FIG. 2, off-state leakage current, $I_{off}$, for the fast transistor increases by almost two orders of magnitude.

FIG. 3 presents a graph of off-state leakage current as a function of drive current in accordance with an embodiment of the invention. As can be seen FIG. 3, as the drive current for the transistor, $I_{on}$, increases past 50 µA, there is a corresponding increase in off-state leakage current $I_{off}$. Hence, the increased performance resulting from this additional drive current, $I_{on}$, is accompanied by a corresponding increase in off-state current, $I_{off}$, which increases the static power consumption of the chip. This increased static power consumption can be especially troublesome for portable computing devices with limited battery life.

What is needed is a method and an apparatus for manufacturing an integrated circuit that achieves high-performance while substantially minimizing static power consumption caused by off-state leakage current.

Also note that the use of resolution enhancement techniques (RETs) to reduce gate lengths can increase mask cost and increase mask writer time because RETs increase the complexity of the layout. Moreover, RETs can also increase the time required to perform mask inspection.

Hence, what is needed is a method and an apparatus that minimizes the above-described problems of RETs during the process of manufacturing an integrated circuit that still maintains the desired performance characteristics.

SUMMARY

One embodiment of the present invention provides a system that applies resolution enhancement techniques (RETs) selectively to a layout of an integrated circuit. Upon receiving the layout of the integrated circuit, the system identifies a plurality of critical regions within the layout based on an analysis of one or more of, timing, dynamic power, and off-state leakage current. The system then performs a first set of aggressive RET operations on the plurality of critical regions. The system also performs a second set of less aggressive RET operations on other non-critical regions of the layout. By criticality, we are referring to performance, power, and/or off-state leakage current.

In a variation on this embodiment, the system additionally marks critical regions of the layout for subsequent processing steps.

In a variation on this embodiment, the plurality of critical regions can include one or more of, a critical transistor, a critical net, an area within a halo of a critical net, and an area within a halo of a critical transistor.

In a variation on this embodiment, the first set of aggressive RET operations can include, alternating phase shifting, model-based OPC, assist features, and attenuated phase shifting. Moreover, the second set of less aggressive RET operations can include, biasing line widths and rule-based OPC.

In a variation on this embodiment, identifying the plurality of critical regions involves identifying transistors that are located on critical paths in the integrated circuit which affect timing of the integrated circuit.

In a variation on this embodiment, performing the first set of aggressive RET operations involves decreasing gate lengths of the critical transistors to reduce delay through the critical transistors. Moreover, performing the second set of less aggressive RET operations involves adjusting gate lengths of the other non-critical transistors to limit static power consumption of the other non-critical transistors caused by off-state leakage current.

In a variation on this embodiment, performing the first set of aggressive RET operations involves applying RETs to gates of the critical transistors.

In a variation on this embodiment, applying RETs to the gates of the critical transistors involves applying optical proximity correction to gates of the critical transistors.

In a variation on this embodiment, applying RETs to the gates of the critical transistors involves using phase shifters on a phase shifting mask to bias gates of the critical transistors so that the critical transistors have a different gate length than the other non-critical transistors in the layout.

In a variation on this embodiment, receiving the layout involves receiving the layout of the integrated circuit in GDS II stream format. Although GDS-II format is mentioned specifically, more generally any input or output format can be used, e.g. the newly developed OpenAccess format.

DETAILED DESCRIPTION

Wafer Fabrication Process

Figure 4:
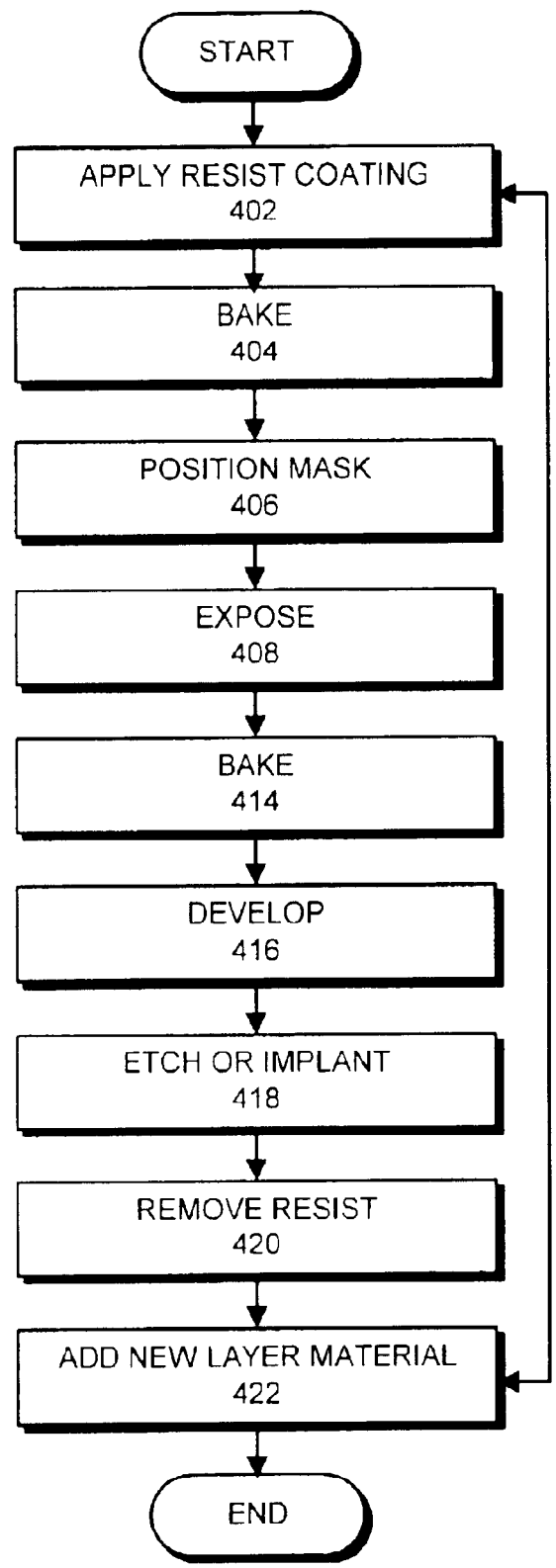
FIG. 4 is a flow chart illustrating the wafer fabrication process in accordance with an embodiment of the invention.

FIG. 4 is a flow chart illustrating the operation of the system that performs a wafer fabrication process in accordance with an embodiment of the invention. The system starts by applying a photoresist layer to the top surface of a wafer (step 402). Next, the system bakes the photoresist layer (step 404). The system then positions a mask over the photoresist layer (step 406), and exposes the photoresist layer through the mask (step 408). Next, the system optionally bakes the wafer again (step 414) before developing the photoresist layer (step 416). Next, either a chemical etching or ion implantation step takes place (step 418) before the photoresist layer is removed (step 420). (Note that in the case of a lift-off process, a deposition operation can take place.) Finally, a new layer of material can be added and the process can be repeated for the new layer (step 422).

Note that in a double exposure process that makes use of a phase shift mask, the system additionally (1) positions the phase shift mask over the photoresist layer, and (2) exposes the photoresist layer through the phase shift mask. These additional steps take place between steps 408 and 414 in FIG. 4.

Process of Producing a Layout

Figure 5:
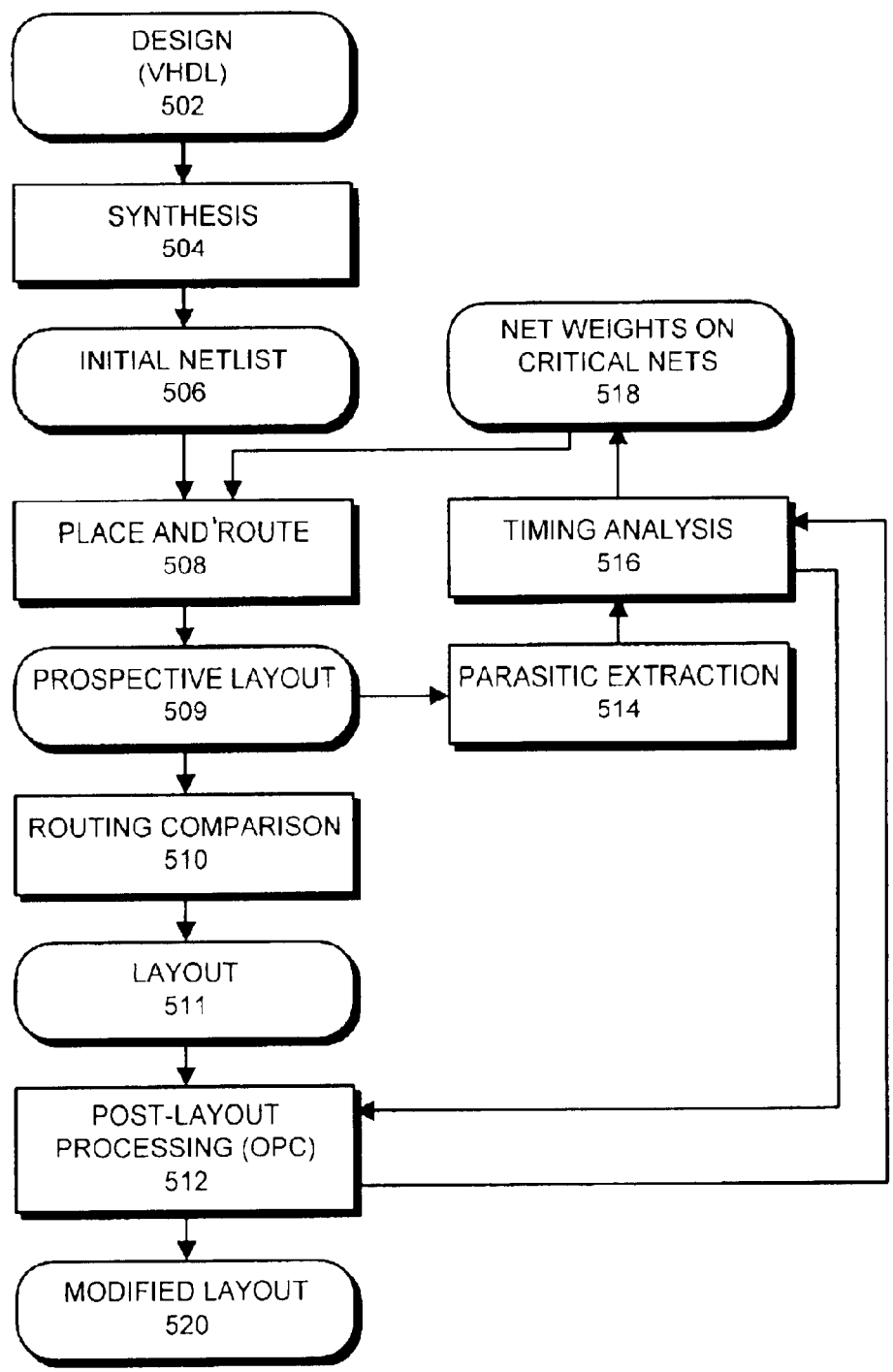
FIG. 5 illustrates the process of producing a layout for an integrated circuit in accordance with an embodiment of the invention.

FIG. 5 illustrates the process of producing a layout for an integrated circuit in accordance with an embodiment of the invention. The process starts when a circuit designer produces a design 502 in VHDL, or some other hardware description language. VHDL is an acronym for VHSIC Hardware Description Language. (VHSIC is a Department of Defense acronym that stands for very high-speed integrated circuits.) The VHDL standard has been codified in Institute for Electrical and Electronic Engineers (IEEE) standard 1076-1993.

Design 502 feeds through a synthesis tool 504 which produces an initial gate netlist 506 for the integrated circuit. This initial netlist 506 feeds into a place and route tool 508, which places logic cells and routes nets between the logic cells to produce a prospective layout 509.

Prospective layout 509 feeds into routing comparison tool 510. Routing comparison tool 510 verifies that the prospective layout 509 is topologically equivalent to the circuit specified by initial netlist 506. If prospective layout 509 is not topologically equivalent to initial netlist 506, an error is indicated and appropriate action is taken.

Otherwise, the prospective layout 509 feeds into parasitic extraction tool 514, which extracts resistance, capacitance and possibly inductance parameters from prospective layout 509. These parameters are used by timing analysis tool 516 to estimate timing for the circuit layout. Timing analysis tool 516 can optionally output net weights on critical nets 518 that feed back into place and route tool 508. Place and route tool 508 uses these net weights to tune placement of the circuit elements, if necessary, to generate a new prospective layout 509.

If prospective layout 509 meets timing, prospective layout 509 becomes layout 511, which can be in the form of a hierarchical specification expressed in a format such as GDSII.

Next, layout 511 feeds into post-layout processing tool 512, which performs optical proximity correction (OPC) to compensate for optical effects that arise during the photolithography process. In one embodiment of the invention, during the OPC process, post-layout processing tool 512 selectively modifies transistor gate lengths for critical transistors as is described below with reference to FIG. 6.

The output of post-layout processing tool 512 is modified layout 520. Modified layout 520 is subsequently used to generate one or more masks that are used in the wafer fabrication process described above with reference to FIG. 4.

Note that the masks have to be inspected for acceptance by the wafer manufacturer. One of the inspection procedures is to measure the CDs at designated points. The CDs of the gates that have been modified are more critical than others and will be measured to qualify the mask.

Selectively Modifying Transistor Gates

Figure 6:
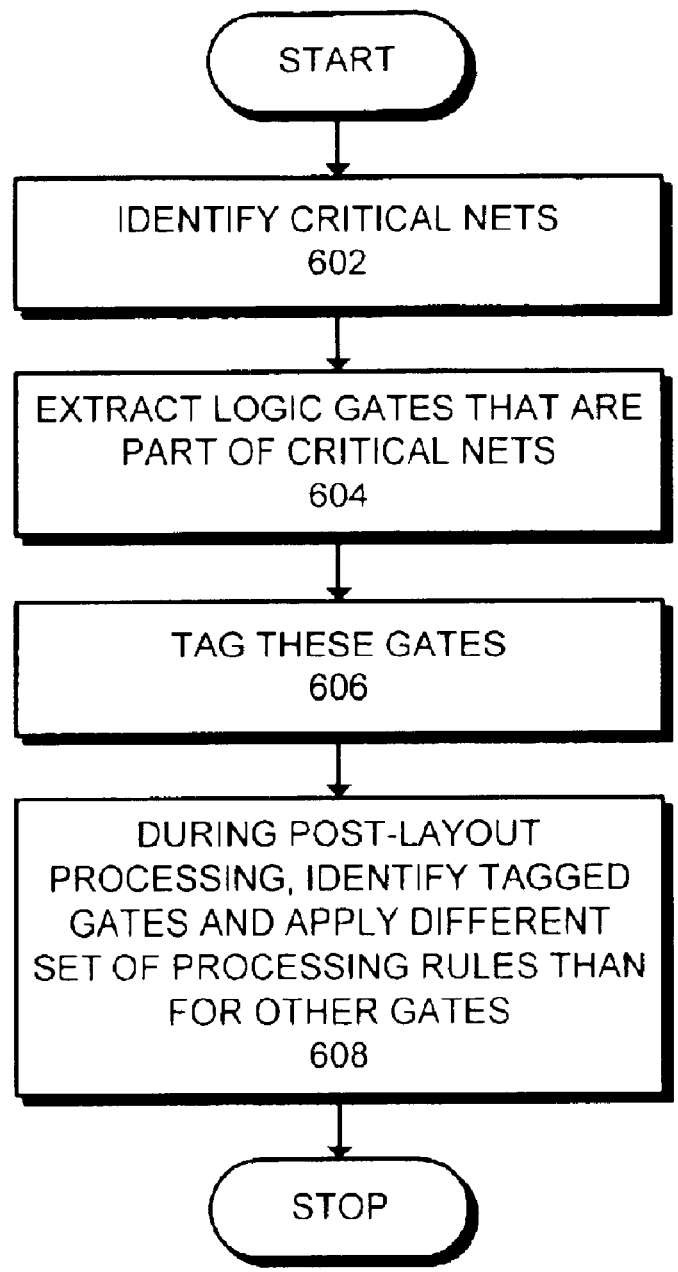
FIG. 6 is a flow chart illustrating the process of selectively modifying transistor gates in accordance with an embodiment of the invention.

FIG. 6 is a flow chart illustrating the process of selectively modifying transistor gates in accordance with an embodiment of the invention. A first portion of this process operates while timing analysis tool 516 is analyzing timing for the layout. In doing so, timing analysis tool 516 identifies critical regions that contain critical nets and/or transistors that lie on critical paths of the circuit (step 602). This identification can be based on factors, such as timing, dynamic power, and off-state leakage current. The system then extracts logic gates within these critical regions (step 604) and tags these gates for subsequent processing (step 606). Note that this tagging can be accomplished through a number of techniques, such as placing shapes in another layer, or adding tags.

Note that the overall functionality of a logic circuit is determined by a collection of logical operations that are implemented by connecting together a set of logic cells to form a logical path. The performance of the circuit depends upon how fast these operations can be carried out, which in turn depends on the time required for signals to travel through the logical path. There can be millions of logical paths in a circuit, but only a small fraction of them determine the final performance of the circuit. These are the "critical paths" and typically constitute about 5% of the total paths.

A second portion of the selective modification process operates while post-layout processing tool 512 processes layout 511 to produce modified layout 520. In doing so, post-layout processing tool 512 identifies tagged gates and applies a different set of processing rules to the tagged gates than for other gates in the layout (step 608).

For example, applying a first set of processing rules to the tagged gates can involve applying aggressive RET operations, such as alternating phase shifting, model-based OPC, assist features, and attenuated phase shifting. Moreover, applying a second the second set of processing rules to the other gate can involve applying less aggressive RET operations, such as biasing line widths and rule-based OPC.

The different processing rules cause transistors in these gates to be modified based on the device characteristics for the technology. The key metrics to be considered in modifying these gates are the $I_{off}$ versus gate length (L) curve that appears in FIG. 1, and the $I_{on}$ versus $I_{off}$ curve that appears in FIG. 2. The curve in FIG. 2 is obtained by measuring $I_{on}$ and $I_{off}$ for different gate lengths. These curves can be generated from the SPICE device model files that are typically provided by the foundry.

Figure 1:
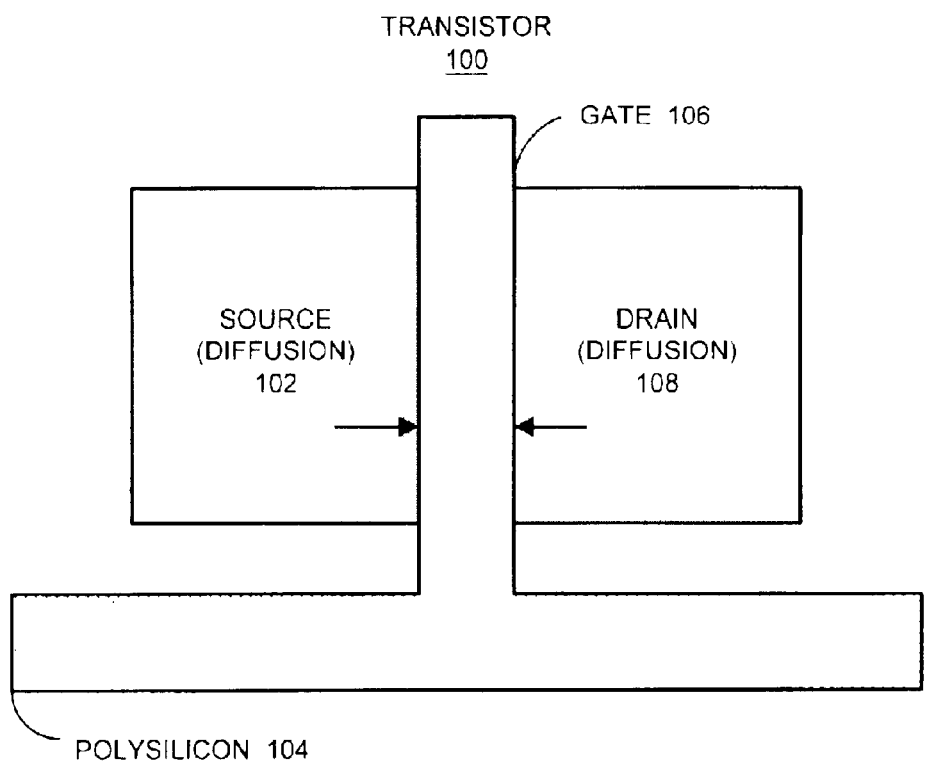
FIG. 1 illustrates a polysilicon field effect transistor in accordance with an embodiment of the invention.
Figure 2:
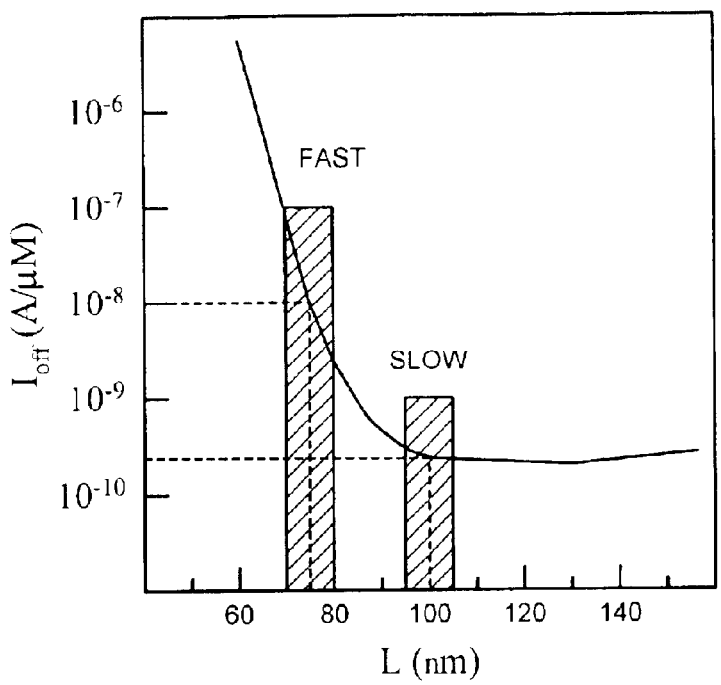
FIG. 2 presents a graph of off-state leakage current as a function of gate length in accordance with an embodiment of the invention.
Figure 3:
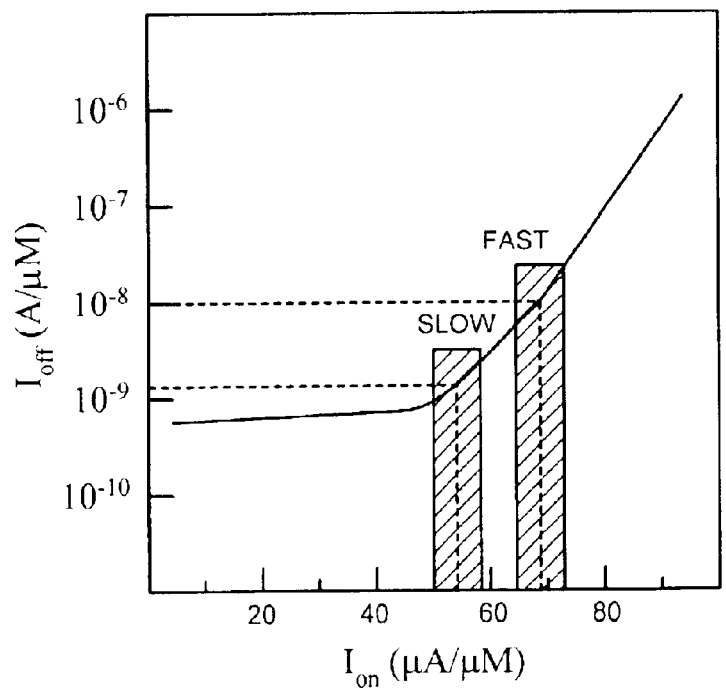
FIG. 3 presents a graph of off-state leakage current as a function of drive current in accordance with an embodiment of the invention.

Referring to FIG. 1, note that beyond a certain gate-length the leakage current increases exponentially. The target gate critical dimension (CD) for the critical cells are determined from FIG. 1 based on the highest leakage current that can be tolerated and the expected variation of CD around the target CD. For example, in the above case the target CD is 70 nm.

The gate CD of the non-critical cells can be increased so as to lie in the low leakage portion of the curve. In the above case it turns out to be about 100 nm.

If all the cells have one target CD it would probably be set at 85 nm in order to keep the total leakage within limits. In contrast, the selective modification process described above breaks up the overall gate distribution into two separate distributions. One distribution of gates called "fast" has high $I_{on}$ (drive currents) but also high $I_{off}$ (leakage currents). The second distribution called "slow" has low leakage currents with less drive strength, but are still within the limits set by the worse case model for delays.

Figure 7:
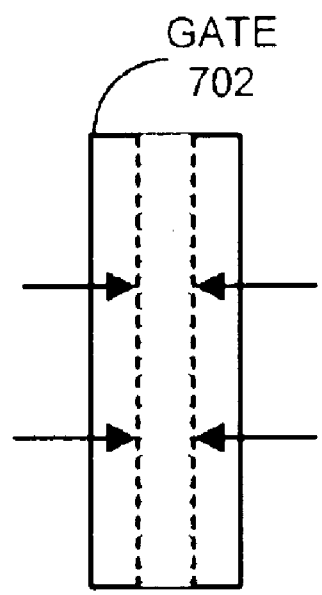
FIG. 7 illustrates biasing of a gate through optical proximity correction in accordance with an embodiment of the invention.

FIG. 7 illustrates how gate 702 is biased through optical proximity correction in accordance with an embodiment of the invention. As is illustrated in FIG. 7, an optical proximity correction operation performed by post-layout processing tool 512 reduces the length of gate 702 as is indicated by the dashed lines in FIG. 7. This provides more drive current and faster switching, but increases off-state leakage current.

Figure 8:
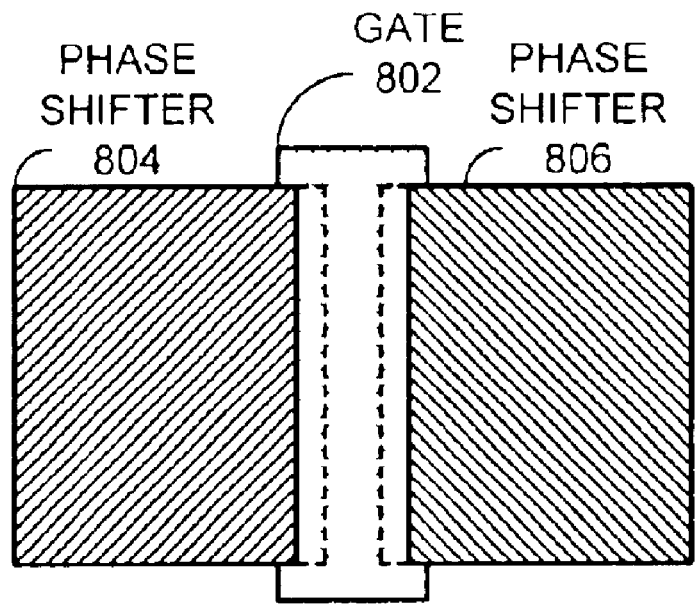
FIG. 8 illustrates biasing of a gate through modification of phase shifters in accordance with an embodiment of the invention.

FIG. 8 illustrates biasing of gate 802 through modification of phase shifters in accordance with an embodiment of the invention. In this embodiment, the length of the gate 802 is defined by phase shifters 804 and 806. For the critical gates, the gate length is decreased by extending phase shifters 804 and 806 further into gate 802 as is indicated by the dashed lines in FIG. 8.

The impact of the above-described process is best understood by considering an example of a circuit with 5 million gates. If the CD of all of the gates is set to the value needed to achieve desired performance, the leakage would be $10^{-8}$ A per gate, which corresponds to a net leakage of 50 mA. Assuming that the total number of gates in critical paths is 250 K and the leakage of the remaining gates is decreased to $10^{-9}$ A, then the net leakage is reduced by 90% to 5 mA without loss of performance.

Note that more aggressive OPC can used for fast gates in order to ensure a tighter distribution of CDs and a less aggressive OPC for slow gates. This reduces computation time compared to a case where all the gates are treated as being critical. In one implementation, aggressive OPC could be model-based OPC (which adds more polygons and is more computationally intensive) and the less aggressive OPC could be rule-based.

Note that using less RET results in less layout complexity, which can reduce the time involved in the mask writing process.

Also note that mask (and wafer) inspection time can be reduced. For example, the mask inspection process can receive information identifying the previously identified critical regions within the layout. This can be accomplished by examining the tags generated in step 606 of FIG. 6. The mask (or wafer) inspection process can then weight the inspection locations more heavily towards the critical regions.

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for applying resolution enhancement techniques (RETs) selectively to a layout of an integrated circuit, the method comprising:

receiving the layout of the integrated circuit, wherein receiving the layout involves receiving the layout of the integrated circuit in one of a GDS II stream format and an OpenAccess database format;

identifying a plurality of critical regions within the layout based on an analysis of one or more of, timing, dynamic power, and off-state leakage current;

performing a first set of aggressive RET operations on the plurality of critical regions; and performing a second set of less aggressive RET operations on other non-critical regions of the layout, wherein the non-critical regions correspond to areas in the layout outside the plurality of critical regions.

2. The method of claim 1, further comprising marking the plurality of critical regions of the layout for subsequent processing steps.

3. The method of claim 1, wherein a critical region in the plurality of critical regions can include one or more of:

a critical transistor;

a critical net;

an area within a halo of a critical net; and an area within a halo of a critical transistor.

4. The method of claim 1, wherein the first set of aggressive RET operations can include, alternating phase shifting, model-based OPC, assist features, and attenuated phase shifting; and wherein the second set of less aggressive RET operations can include, biasing line widths and rule-based OPC.

5. The method of claim 1, wherein identifying the plurality of critical regions involves identifying transistors that are located on critical paths in the integrated circuit which affect timing of the integrated circuit.

6. The method of claim 1, wherein performing the first set of aggressive RET operations involves decreasing gate lengths of the critical transistors to reduce delay through the critical transistors; and wherein performing the second set of less aggressive RET operations involves adjusting gate lengths of the other non-critical transistors to limit static power consumption of the other non-critical transistors caused by off-state leakage current.

7. The method of claim 1, wherein performing the first set of aggressive RET operations involves applying RETs to gates of the critical transistors.

8. The method of claim 7, wherein applying RETs to the gates of the critical transistors involves applying optical proximity correction to gates of the critical transistors.

9. The method of claim 7, wherein applying RETs to the gates of the critical transistors involves using phase shifters on a phase shifting mask to bias gates of the critical transistors so that the critical transistors have a different gate length than the other non-critical transistors in the layout.

10. An integrated circuit created through a process that applies resolution enhancement techniques (RETs) selectively to a layout of an integrated circuit, the process comprising:

receiving the layout of the integrated circuit, wherein receiving the layout involves receiving the layout of the integated circuit in one of a GDS II stream format and an OpenAccess database format;

identifying a plurality of critical regions within the layout based on an analysis of one or more of, timing, dynamic power, and off-state leakage current;

performing a first set of aggressive RET operations on the plurality of critical regions;

wherein performing the first set of aggressive RET operations involves decreasing gate lengths of the critical transistors to reduce delay through the critical transistors; and performing a second set of less aggressive RET operations on other non-critical regions of the layout, wherein the non-critical regions correspond to areas in the layout outside the plurality of critical regions;

wherein performing the second set of less aggressive RET operations involves adjusting gate lengths of the other non-critical transistors to limit static power consumption of the other non-critical transistors caused by off-state leakage current.

11. The integrated circuit of claim 10, the process further comprising marking the plurality of critical regions of the layout for subsequent processing steps.

12. The integrated circuit of claim 10, wherein a critical region in the plurality of critical regions can include one or more of:

a critical transistor;

a critical net;

an area within a halo of a critical net; and an area within a halo of a critical transistor.

13. The integrated circuit of claim 10, wherein the first set of aggressive RET operations can include, alternating phase shifting, model-based OPC, assist features, and attenuated phase shifting; and wherein the second set of less aggressive RET operations can include, biasing line widths and rule-based OPC.

14. The integrated circuit of claim 10, wherein identifying the plurality of critical regions involves identifying transistors that are located on critical paths in the integrated circuit which affect timing of the integrated circuit.

15. The integrated circuit of claim 10, wherein performing the first set of aggressive RET operations involves decreasing gate lengths of the critical transistors to reduce delay through the critical transistors; and wherein performing the second set of less aggressive RET operations involves adjusting gate lengths of the other non-critical transistors to limit static power consumption of the other non-critical transistors caused by off-state leakage current.

16. The integrated circuit of claim 10, wherein performing the first set of aggressive RET operations involves applying RETs to gates of the critical transistors.

17. The integrated circuit of claim 16, wherein applying RETs to the gates of the critical transistors involves applying optical proximity correction to gates of the critical transistors.

18. The integrated circuit of claim 16, wherein applying RETs to the gates of the critical transistors involves using phase shifters on a phase shifting mask to bias gates of the critical transistors so that the critical transistors have a different gate length than the other non-critical transistors in the layout.

* * * * *

UNITED STATES PATENT AND TRADEMARK OFFICE
CERTIFICATE OF CORRECTION

PATENT NO. : 6,928,635 B2 Page 1 of 1
APPLICATION NO. : 10/254702
DATED : August 9, 2005
INVENTOR(S) : Dipankar Pramanik and Michael Sanie It is certified that error appears in the above-identified patent and that said Letters Patent is hereby corrected as shown below:

On the Title page item (73), delete the Assignee,

"Numerical Technologies, Inc., San Jose CA (US)" and replace with the Assignee --Synopsys, Inc., Mountain View, CA (US)--.

Signed and Sealed this

Tenth Day of July, 2007

JON W. DUDAS
*Director of the United States Patent and Trademark Office*